United States Patent [19]

Ishii et al.

[11] 4,202,917
[45] May 13, 1980

[54] METHOD FOR MANUFACTURE OF INDIUM OXIDE (III) FILM

[75] Inventors: Eiichi Ishii, Toyonaka; Masanori Nakane, Takatsuki; Hiroshi Ishikawa; Itsuki Uehara, both of Ikeda; Yoshizo Miyake, Toyonaka, all of Japan

[73] Assignee: Agency of Industrial Science & Technology, Ministry of International Trade & Industry, Tokyo, Japan

[21] Appl. No.: 18,260

[22] Filed: Mar. 7, 1979

[30] Foreign Application Priority Data

Mar. 31, 1978 [JP] Japan .................................. 53-38663

[51] Int. Cl.² ........................... B05B 5/00; B05D 3/02
[52] U.S. Cl. ................................. 427/161; 106/286.1; 106/287.18; 427/255; 427/372.2; 427/376.2; 427/377; 423/624

[58] Field of Search .................. 427/255, 161, 372 R, 427/377, 376 A; 423/624; 106/286.1, 287.18

[56] References Cited

FOREIGN PATENT DOCUMENTS 1351113  4/1974  United Kingdom ..................... 423/624

OTHER PUBLICATIONS

Dale; E. B. et al., *Evaporation Techniques & Properties of IaSb Films*, pp. 348-353, 1975.

Primary Examiner—Michael R. Lusignan
Attorney, Agent, or Firm—Oblon, Fisher, Spivak, McClelland & Maier

[57] ABSTRACT

An indium oxide (III) film produced by a method which comprises first forming a film of indium oxide (I) and subsequently oxidizing the film.

5 Claims, No Drawings

METHOD FOR MANUFACTURE OF INDIUM OXIDE (III) FILM

BACKGROUND OF THE INVENTION

This invention relates to a method for the manufacture of an indium oxide (III) ($In_2O_3$) film. The term "indium oxide" applies to both $In_2O$ and $In_2O_3$. For the sake of distinction, therefore, these oxides will be referred to hereinafter as indium oxide (I) and indium oxide (III) respectively.

Films of indium oxide (III) are useful for electroconductive glass articles, oxide film resistors, printed circuits, etc. It has heretofore been known in the art to produce indium oxide (III) films by a procedure of causing indium oxide (III) to be vacuum deposited on the surface of a given substrate (Japanese Patent Publication Sho 49 (1974)-45988. However the nature of the indium oxide (III) which is used directly as the starting material in this method makes it necessary to use an electron-beam heater or other expensive and complicated apparatus capable of generating high-energy electron rays for the vacuum deposition involved.

The inventors searched for a way for overcoming the aforementioned difficulty encountered in the manufacture of indium oxide (III) films. They have, consequently, developed a method which, by use of a much less expensive apparatus, produces an indium oxide (III) film possessing a quality comparable with or better than the quality of indium oxide (III) film manufactured by the conventional electron-beam heater.

An object of the present invention is to provide a method which produces an indium oxide (III) film on a substrate with high efficiency by use of a very simple apparatus.

SUMMARY OF THE INVENTION

To accomplish the object described above according to the present invention, there is provided a method which comprises first forming a film of indium oxide (I) on the surface of a given substrate and subsequently oxidizing the film in the atmosphere of a gas. The formation of the film of indium oxide (I) on the surface of the substrate can be effected by means of vacuum deposition. Since indium oxide (I) is produced by heating a mixture of indium oxide (III) with indium, the film to be initially formed on the substrate may be produced by heating this mixture under a low-pressure condition to vacuum deposit indium oxide (I) on the selected substrate. The conversion of the indium oxide (I) film into the indium oxide (III) film, is carried out by oxidation in the atmosphere of a gas. Examples of gases which are advantageously used for this purpose include steam, carbon dioxide, air, oxygen and suitable combinations of such gases.

DESCRIPTION OF THE PREFERRED EMBODIMENTS

The properties of indium oxide (III) and indium oxide (I) will be described.

Indium oxide (I) is a volatile substance which sublimates upon exposure to heating at temperature of about 600° to 700° C. under a vacuum. We understand that the melting point of indium oxide (III) is in the neighborhood of 2000° C., but its sublimating point is not certain. According to literature (Gmelins Hundbuch der Anorganischen Chemie, Indium, p. 67, 1936), what has been taken to be the sublimation of this compound under a high vacuum at extremely high temperatures is actually the sublimation of indium oxide (I) originating in the dissociation of indium oxide (III) represented by the formula:

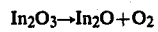

Although the conditions for inducing this reaction of dissociation may be inferred through calculation of changes in free energy involved in the reaction, the reaction itself does not occur readily. Through the inventors' own experiment, however, it has been ascertained that under conditions of $10^{-4}$ to $10^{-5}$ Torrs of vacuum and 1500° C. of temperature, indium oxide (III) does not show any change of weight (sign of dissociation). Thus, the indium oxide (III) film has heretofore been manufactured by use of an apparatus such as an electron-beam heater which is capable of exposing indium oxide (III) directly to high enough energy for the compound to be dissociated, sublimated and re-bound.

Since the method of the present invention uses indium oxide (I) as the starting material, the heating of this compound can be effected by means of an inexpensive apparatus making use of the phenomenon of resistance heating, for example. To be specific, this invention first causes indium oxide (I) to be vacuum deposited on the surface of a given substrate under a vacuum at temperatures of about 600° to 700° C. with a simple, inexpensive heating apparatus and, thereafter, oxidizes the deposited indium oxide (I) film with steam, carbon dioxide, air, oxygen or a suitable combination of such gases and consequently converts it into a transparent indium oxide (III) film. In terms of cost of equipment, the resistance-heating apparatus is far less expensive than the conventional electron-beam heater.

In the working of the present invention, the indium oxide (I) film is formed on the surface of a substrate. The formation of this film is effected preferably by the vacuum deposition method, although other methods using such phenomena as spattering are also useable for the purpose. Vacuum deposition is a technique which involves thermally evaporating a solid metallic substance such as indium oxide in a vacuum and causing the vaporized substance to be deposited in the form of a film on the surface of a substrate which may be a glass sheet or quartz plate, for example. In this case, the vacuum deposition is advantageously carried out under a pressure of the order of $10^{-3}$ to $10^{-5}$ Torrs. The temperature at which the vacuum deposition is advantageously carried out is not less than 500° C. Although no upper limit to this temperature is specifically fixed, it is practically desirable for the vacuum deposition to be performed at temperatures near 750° C. The desirable thickness of the indium oxide (I) film thus formed is on the order of 1000 to 3000 Å (Angstroms). The reason for this limited range of the film thickness is that fine particles of the evaporated indium oxide (I) tend to deposit in the form of scattered islands on the surface of the substrate when the film thickness is less than 1000 Å, whereas the manufacture of the film itself proves to be uneconomical when the film thickness exceeds 3000 Å.

For the purpose of film thickness adjustment, the film thickness can be precalculated on the basis of the velocity of the evaporation of indium oxide (I) determinable from the relation between the temperature of the reaction involved and the saturated vapor pressure of indium oxide (I), with due consideration paid to other important factors such as the angle and distance of the substrate relative to the indium oxide (I) and the mass and density of the indium oxide (I). Naturally, the theoretical adjustment of film thickness mentioned above should be carried out in combination with direct or indirect observation and control of the reaction system involved.

In preparation for the vacuum deposition, the substrate may be preheated. When the substrate is preheated to temperatures of about 200° to 350° C., the deposited film of indium oxide (I) is obtained in ample compactness.

The indium oxide (I) which is used in working the present invention can easily be prepared by reducing indium oxide (III) with hydrogen at temperatures of about 400° C. It may otherwise be obtained by mixing indium oxide (III) with indium at a molar ratio of 1:4 and heating the mixture under a vacuum or in the atmosphere of an inert gas. In the manufacture of indium oxide (I) by the reduction of indium oxide (III) with hydrogen, the amount of indium oxide (III) which reduces to metallic indium (In) may increase, when the reducing temperature is too high and the reducing duration is long, whereas the reaction velocity is lowered when the temperature is too low. The optimum temperature for the reduction, therefore, falls in the range of from 370° to 430° C.

As the starting material for the formation of indium oxide (I) film, indium oxide (I) alone or a mixture of indium oxide (III) with metallic indium is preferably used. Such a starting material may be used in the form of powder or tablets.

When necessary, the starting material may incorporate therein some other compound or metal. The content of such an additive should not exceed the upper limit beyond which the presence of the additive adversely affects the formation of the film. Practically, the upper limit of this content is about 10% by weight.

Examples of additives include tin oxide and magnesium fluoride. The incorporation of tin oxide is aimed at production of electroconductive films with low resistance films capable of intercepting infrared rays and that of magnesium fluoride at production of transparent protective films.

In the case of the mixture, the molar ratio of indium oxide (III) to metallic indium should range from 0.1 to 0.6 of the former per 1 of the latter.

The reason for the limited range of molar ratio is that, as is clearly seen from the reaction formula, $4In+In_2O_3 \rightleftarrows 3In_2O$, the optimum molar ratio is 0.25 and that the range mentioned above is feasible from the practical point of view.

The indium oxide (I) film formed as described above on the surface of the substrate is oxidized into an indium oxide (III) film in the atmosphere of a gas. The inventors have made an elaborate study of the conversion of the indium oxide (I) film to the indium oxide (III) film. The oxidation in the atmosphere can occur in three ways. The three possible reactions and typical calculations of free energy changes at main two-point temperatures of each of the reactions are shown in Table 1 below.

Table 1

| Formula No. | Reaction formula | Change in free energy (Kcal/mol) 298° K. | 1000° K. |
|---|---|---|---|
| (1) | $In_2O + 2CO_2 \rightarrow In_2O_3 + 2CO$ | −48.6 | −28.6 |
| (2) | $In_2O + 2H_2O \rightarrow In_2O_3 + 2H_2$ | −116.9 | −75.9 |
| (3) | $In_2O + O_2 \rightarrow In_2O_3$ | −171.5 | −121.9 |

The changes in free energy in the reactions shown in Table 1 suggest that the reactions tend to proceed invariably toward the right members of the expressions, particularly so in the case of the reaction of formula (3).

The inventors have experimented on the oxidation of indium oxide (I) with steam, carbon dioxide and oxygen with the aid of a thermobalance. The conditions for the experiment and the results are shown in Table 2 below.

Experiment conditions—70 mg of indium oxide (I) (pulverized to 100 mesh), with $N_2$ fed at flow rate of 100 ml/min. and steam, carbon dioxide or oxygen fed at a fixed flow rate of 60 ml/min.)

Table 2

| Type of gas | Initial temperature of reaction (°C.) | Temperature of heating and velocity of oxydation (mg of $In_2O$/min.) 420° C. | 580° C. |
|---|---|---|---|
| $H_2O$ | 200 | 2.3 | 50 |
| $CO_2$ | 300 | 0.4 | 9.2 |
| $O_2$ | 300 | 0.1 | 0.6 |

It is seen from Table 2 that the oxidation with oxygen proceeds most slowly and that where the oxidation is carried out with oxygen (air), perfect oxidation of indium oxide (I) to indium oxide (III) requires use of a high temperature. It is further noted that the reaction temperature is low and the reactivity is high where the oxidation is carried out with steam or carbon dioxide. The reactivity of steam is particularly conspicuous. When steam alone, carbon dioxide alone or a mixture of the two gases is used, preferably in a form blended with air, perfect oxidation of the vacuum-deposited indium oxide (I) is attained at a particularly low temperature.

The atmospheres which are used advantageously for the purpose of this oxidation and their respective preferable temperature ranges are shown below.

| | Temperature range (°C.) |
|---|---|
| Steam | 200 to 500 |
| Carbon dioxide | 300 to 600 |
| Steam-carbon dioxide mixture (1:1 voluminal ratio) | 200 to 500 |
| Air | } 300 to 800 |
| Oxygen | |

According to the present invention, the indium oxide (III) film can be produced by such a simple procedure as described above. To meet its varying uses more satisfactorily, the indium oxide (III) film manufactured by the method of this invention may be overlaid with a transparent, low-refraction film of tin oxide or magnesium fluoride.

The indium oxide (III) film obtained by the present invention is transparent and electrically conductive and is useful in surface display devices and surface heating elements adapted to operate with liquid crystal, EL (Electroluminescence) and plasma.

Now, the present invention will be described with reference to working examples.

EXAMPLE 1

Indium oxide (I) powder was molded in the form of tablets. The tablets were placed in a vacuum container provided with a resistance heater and vaporized under a vacuum of $10^{-4}$ to $10^{-5}$ Torr at temperatures of 600° to 700° C. and allowed to deposit on the surface of a glass sheet kept at temperatures of 200° to 350° C. Consequently, an opaque indium oxide (I) film 1500 Å in thickness was obtained on the glass sheet. This film was then heated to 300° C. in the atmosphere of steam for ten minutes to produce a transparent indium oxide (III) film 1500 Å in thickness. The film was found to possess 80 to 90% of transmittance to visible light and 100 to 400 Ω/sq of surface resistance.

EXAMPLE 2

A mixture obtained by thoroughly mixing indium oxide (III) with metallic indium powder at a molar ratio of 1:4 was molded in the form of tablets. The tablets were then subjected to vacuum deposition and oxidation by faithfully following the procedure of Example 1. Consequently, there was obtained an indium oxide (III) film 2000 Å in thickness. This film was found to possess 70 to 80% of transmittance to visible light and 300 to 500 Ω/sq of surface resistance.

EXAMPLE 3

By following the procedure of Example 1, an indium oxide (I) film 1500 Å in thickness was vacuum deposited on the surface of a glass sheet used as the substrate. This film was then heated at 400° C. in the atmosphere of carbon dioxide for ten minutes to oxidize the indium oxide (I) film into a transparent indium oxide (III) film.

This film was found to possess 80 to 90% of transmittance to visible light and 100 to 300 Ω/sq of surface resistance.

EXAMPLE 4

By following the procedure of Example 1, an indium oxide (I) film 2000 Å in thickness was vacuum deposited on the surface of a glass sheet used as the substrate. Then this film was heated at 600° C. in the atmosphere of oxygen (actually air) for ten minutes to oxidize the indium oxide (I) film into a transparent indium oxide (III) film 2000 Å in thickness which was found to possess 70 to 80% of transmittance to visible light and 200 to 300 Ω/sq of surface resistance.

EXAMPLE 5

By following the procedure of Example 1, an indium oxide (I) film 2000 Å in thickness was vacuum deposited on the surface of a glass sheet used as the substrate. Then, this film was heated at 300° C. in the atmosphere of a mixed gas containing air (oxygen), steam and carbon dioxide at a molar ratio of 0.7:0.2:0.1 for ten minutes to oxidize the indium oxide (I) film into an indium oxide (III) film 2000 Å in thickness. This film was found to possess 80 to 90% of transmittance to visible light and 100 to 300 Ω/sq of surface resistance.

What is claimed is:

1. A method for the production of an indium oxide (III) film on the surface of a given substrate, which method comprises first forming an indium oxide (I) film on the surface of the substrate and subsequently oxidizing this indium oxide (I) film.

2. The method according to claim 1, wherein the formation of the indium oxide (I) film on the substrate is accomplished by means of vacuum deposition.

3. The method according to claim 2, wherein the indium oxide (I) film is formed by vacuum depositing indium oxide (I).

4. The method according to claim 1, wherein the indium oxide (I) film is formed by heating a mixture of indium with indium oxide (III).

5. The method according to claim 1, wherein the indium oxide (I) film formed on the surface of the substrate is oxidized by heating the film in the atmosphere of one member or a mixture of two or more members selected from the group consisting of steam, carbon dioxide, air and oxygen.

* * * * *